United States Patent
Yang et al.

(10) Patent No.: US 7,745,833 B2
(45) Date of Patent: Jun. 29, 2010

(54) SEMICONDUCTOR LIGHT EMITTING DEVICE AND FABRICATION METHOD OF THE SAME

(75) Inventors: Cheng-Chung Yang, Huatan Township, Changhua County (TW); Shao-Kun Ma, Donggang Township, Pingtung County (TW); Chuan-Cheng Tu, Taipei (TW); Jen-Chau Wu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 589 days.

(21) Appl. No.: 11/195,528

(22) Filed: Aug. 1, 2005

(65) Prior Publication Data
US 2006/0060869 A1    Mar. 23, 2006

(30) Foreign Application Priority Data
Sep. 21, 2004    (TW) ............................... 93128586 A

(51) Int. Cl.
*H01L 27/15*    (2006.01)
(52) U.S. Cl. .................. 257/81; 257/99; 257/E51.018

(58) Field of Classification Search .................. 257/59, 257/72, 79, 89, 98, 97, 99, 103, E51.018, 257/E51.019, E51.51, 81
See application file for complete search history.

(56) References Cited

U.S. PATENT DOCUMENTS 6,541,293 B2 *   4/2003   Koide et al. .................. 438/22
2004/0041160 A1 * 3/2004   Zhao et al. .................. 257/79

* cited by examiner

*Primary Examiner*—Hoa B Trinh
(74) *Attorney, Agent, or Firm*—Morris, Manning & Martin LLP; Tim Tingkang Xia

(57) ABSTRACT

The invention provides a semiconductor light emitting device and the fabrication method of the same. The semiconductor light emitting device according to the invention comprises a multi-layer light emitting structure and a heat conducting layer. The multi-layer light emitting structure comprises a first layer. The first layer has an exposed first surface, and it also has a first thermal conductivity. The heat conducting layer is formed on and covers the first layer. The heat conducting layer has a second thermal conductivity, wherein the second thermal conductivity is greater than the first thermal conductivity.

13 Claims, 6 Drawing Sheets

SEMICONDUCTOR LIGHT EMITTING DEVICE AND FABRICATION METHOD OF THE SAME

BACKGROUND OF THE INVENTION

1. Field of the Invention

The present invention relates to a semiconductor light emitting device and the fabrication method of the same, and more particularly to a semiconductor light emitting device including a heat conducting layer.

2. Description of the Prior Art

In recent years, the light emitting diode of the InGaN series performs excellently in blue light and green light and consequently popularizes the light emitting diode of the InGaN series. The light emitting diode of InGaN series are more importantly employed in illumination apparatuses, like the currently press key systems, back light module of handphones, vehicle illuminating systems, and decorating lights etc.

However, as the techniques progress, the light emitting diode of the InGaN series suffers from increasing heat problem while higher luminance is required, thus affecting the reliability and life time of the light emitting diode of the InGaN series. Therefore, methods to efficiently dissipate the heat from inner light emitting diode have been an important subject of research.

SUMMARY OF THE INVENTION

According to a preferred embodiment of the present invention, the semiconductor light emitting device comprises a multi-layer light emitting structure and a heat conducting layer. The multi-layer light emitting structure comprises a first layer; the first layer has an exposed first surface, and it also has a first thermal conductivity. The heat conducting layer is formed on and covers the first layer. Moreover, the heat conducting layer has a second thermal conductivity, wherein the second thermal conductivity is greater than the first thermal conductivity.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
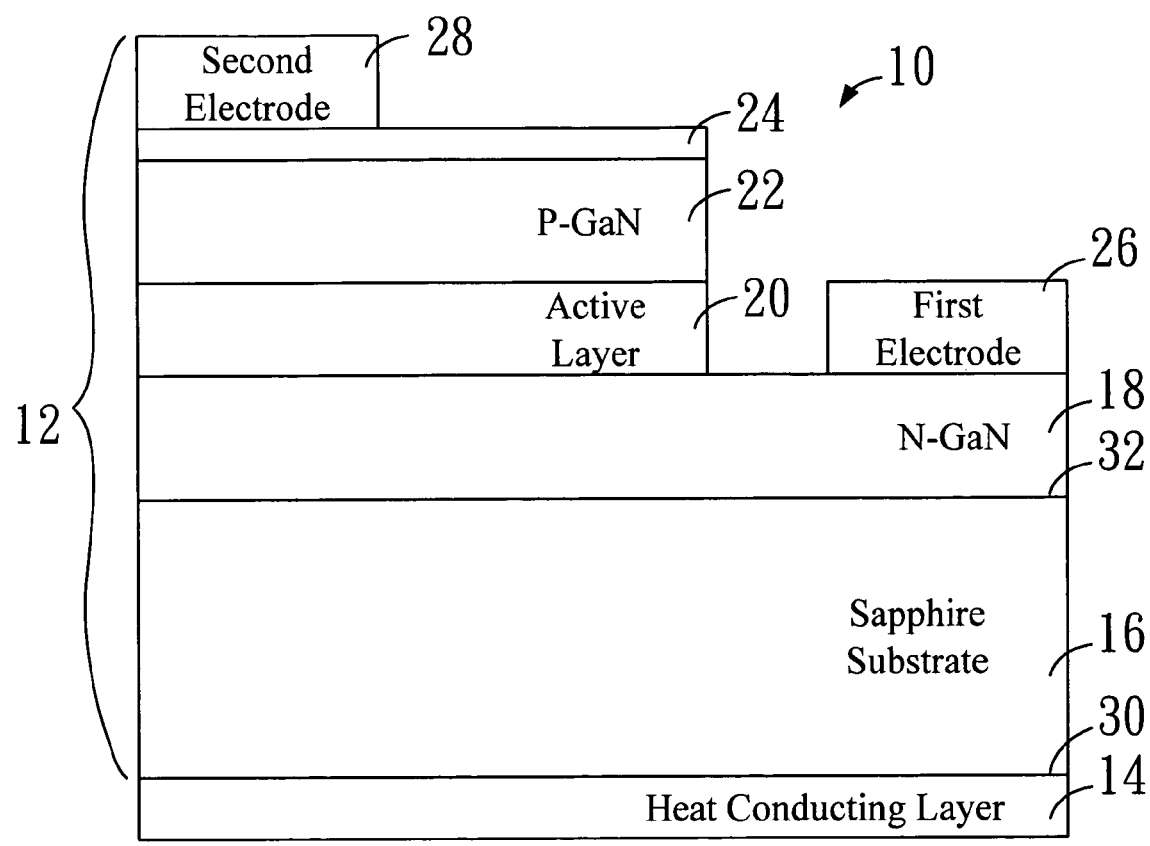
FIG. 1 is a schematic sectional view illustrating the first preferred embodiment of the semiconductor light emitting device according to the present invention.

A preferred embodiment of the semiconductor light emitting device in accordance with the present invention comprises a multi-layer light emitting structure and a heat conducting layer. The multi-layer light emitting structure comprises a first layer. The first layer has an exposed first surface, and it also has a first thermal conductivity. The heat conducting layer is formed on and covers the first layer. The heat conducting layer has a second thermal conductivity, wherein the second thermal conductivity is greater than the first thermal conductivity.

The advantage and spirit of the invention may be understood by the following recitations together with the appended drawings.

TABLE 1

| Material | Thermal Conductivity (cal/sec)/(cm$^2$ · °C./cm) |
|---|---|
| Sapphire | 0.11 |
| Diamond | 1.57 |
| AlN | 0.67 |
| SiC | 0.84 |
| Mo | 0.35 |
| Al | 0.53 |
| Ag | 1 |
| Au | 0.74 |

Obviously, when the semiconductor light emitting device 10 illuminates, the multi-layer light emitting structure 12 generates a great amount of thermal energy consequently. Since the material that formed the heat conducting layer 14 has higher thermal conductivity than that of sapphire substrates 16, the heat conducting layer 14 is able to dissipate the thermal energy of the multi-layer light emitting structure 12 rapidly, so as to lower the temperature of the multi-layer light emitting structure 12. Accordingly, the life time of the semiconductor light emitting device 10 can be prolonged, and the reliability of the semiconductor light emitting device 10 can be improved. In other words, the material that formed the heat conducting layer 14 has higher thermal conductivity than that of sapphire substrates 16, so the heat conducting layer 14 can also be indicated as a heatsink of the sapphire substrate 16; therefore, the heat conducting layer 14 is able to transfer out the thermal energy of the multi-layer light emitting structure 12 rapidly, so as to lower the temperature of the multi-layer light emitting structure 12. Accordingly, the life time of the semiconductor light emitting device 10 can be prolonged, and the reliability of the semiconductor light emitting device 10 can be improved.

Figure 2:
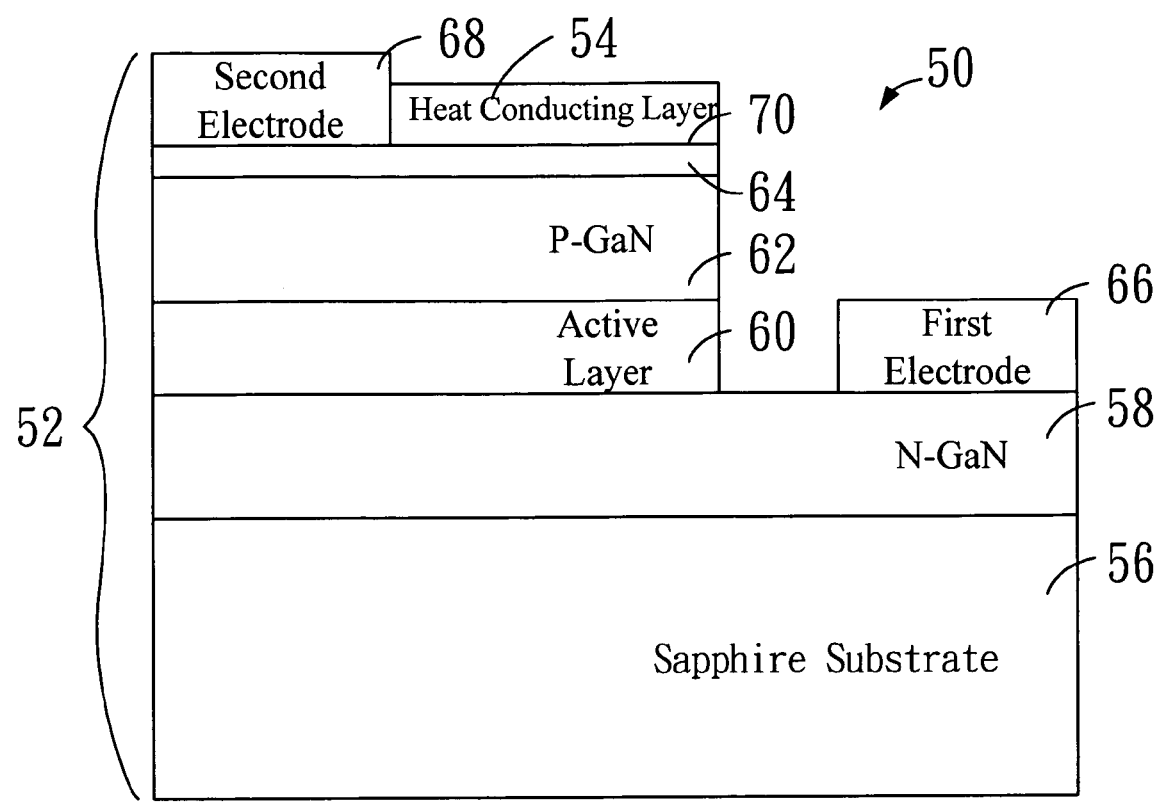
FIG. 2 is a schematic sectional view illustrating the second preferred embodiment of the semiconductor light emitting device according to the present invention.

Referring to FIG. 2, FIG. 2 is a schematic sectional view illustrating the second preferred embodiment of the semiconductor light emitting device 50 according to the present invention. In FIG. 2, the semiconductor light emitting device 50 comprises a multi-layer light emitting structure 52 and a heat conducting layer 54. The multi-layer light emitting structure 52 comprises a sapphire substrate 56, an N-type gallium nitride layer 58, an active layer 60, a P-type gallium nitride 62, a transparent conductive layer 64, a first electrode 66, and a second electrode 68. The transparent conductive layer 64 comprises a third surface 70.

The N-type gallium nitride layer 58 is formed on and covers the sapphire substrate 56. The active layer 60 is formed on and covers one part of the surface of the N-type gallium nitride layer 58. The P-type gallium nitride layer 62 is formed on and covers the active layer 60. The transparent conductive layer 64 is formed on and covers the P-type gallium nitride layer 62. The first electrode 66 is formed on and covers another part of the surface of the N-type gallium nitride layer 58. Moreover, the second electrode 68 is formed on a part of the third surface 70 of the transparent conductive layer 64.

Wherein, the material of the heat conducting layer 64 is selected from ITO, ZnO, InO, ZrO, Au, or Ag etc.

The heat conducting layer 54 is formed on and covers another part of the third surface 70 of the transparent conductive layer 64, wherein the thickness of the heat conducting layer 54 is between 1.5 mm and 10 mm. Furthermore, the heat conducting layer 54 has a second thermal conductivity, and the transparent conductive layer 64 has a third thermal conductivity, wherein the second thermal conductivity is higher than the third thermal conductivity.

In this preferred embodiment, the material of the heat conducting layer 54 is selected from diamond, AlN, SiC, or other similar transparent or semitransparent high thermal conductivity materials. Also, the material of the heat conducting layer 54 is selected from Mo, Al, Ag, Au, or other metals with high thermal conductivity.

Furthermore, the above mentioned materials that form the heat conducting layer 54 have higher thermal conductivity than materials that form the transparent conductive layer 64. Moreover, because some materials can be used to form both the heat conducting layer 54 and the transparent conductive layer 64, the materials that form the heat conducting layer 54 must have higher thermal conductivity than the materials that form the transparent conductive layer 64, so as to accordingly reach the purpose of heat dissipation. The thermal conductivity of the above mentioned materials are shown in Table 2.

TABLE 2

| Material | Thermal Conductivity (cal/sec)/(cm² · °C./cm) |
|---|---|
| ITO | 0.021 |
| Diamond | 1.57 |
| AlN | 0.67 |
| SiC | 0.84 |
| Mo | 0.35 |
| Al | 0.53 |
| Ag | 1 |
| Au | 0.74 |

Obviously, when the semiconductor light emitting device 50 illuminates, the multi-layer light emitting structure 52 generates a great amount of thermal energy consequently. Since the material that formed the heat conducting layer 54 has higher thermal conductivity than that of the transparent conductive layer 64, the heat conducting layer 54 is able to transfer out the thermal energy of the multi-layer light emitting structure 52 rapidly, so as to lower the temperature of the multi-layer light emitting structure 52. Accordingly, the life time of the semiconductor light emitting device 50 can be prolonged, and the reliability of the semiconductor light emitting device 50 can be improved. In other words, the material that formed the heat conducting layer 54 has higher thermal conductivity than that of the transparent conductive layer 64, so the heat conducting layer 54 can also be indicated as a heatsink of the transparent conductive layer 64; therefore, the heat conducting layer 54 is able to transfer out the thermal energy of the multi-layer light emitting structure 52 rapidly, so as to lower the temperature of the multi-layer light emitting structure 52. Accordingly, the life time of the semiconductor light emitting device 50 can be prolonged, and the reliability of the semiconductor light emitting device 50 can be improved.

Figure 3:
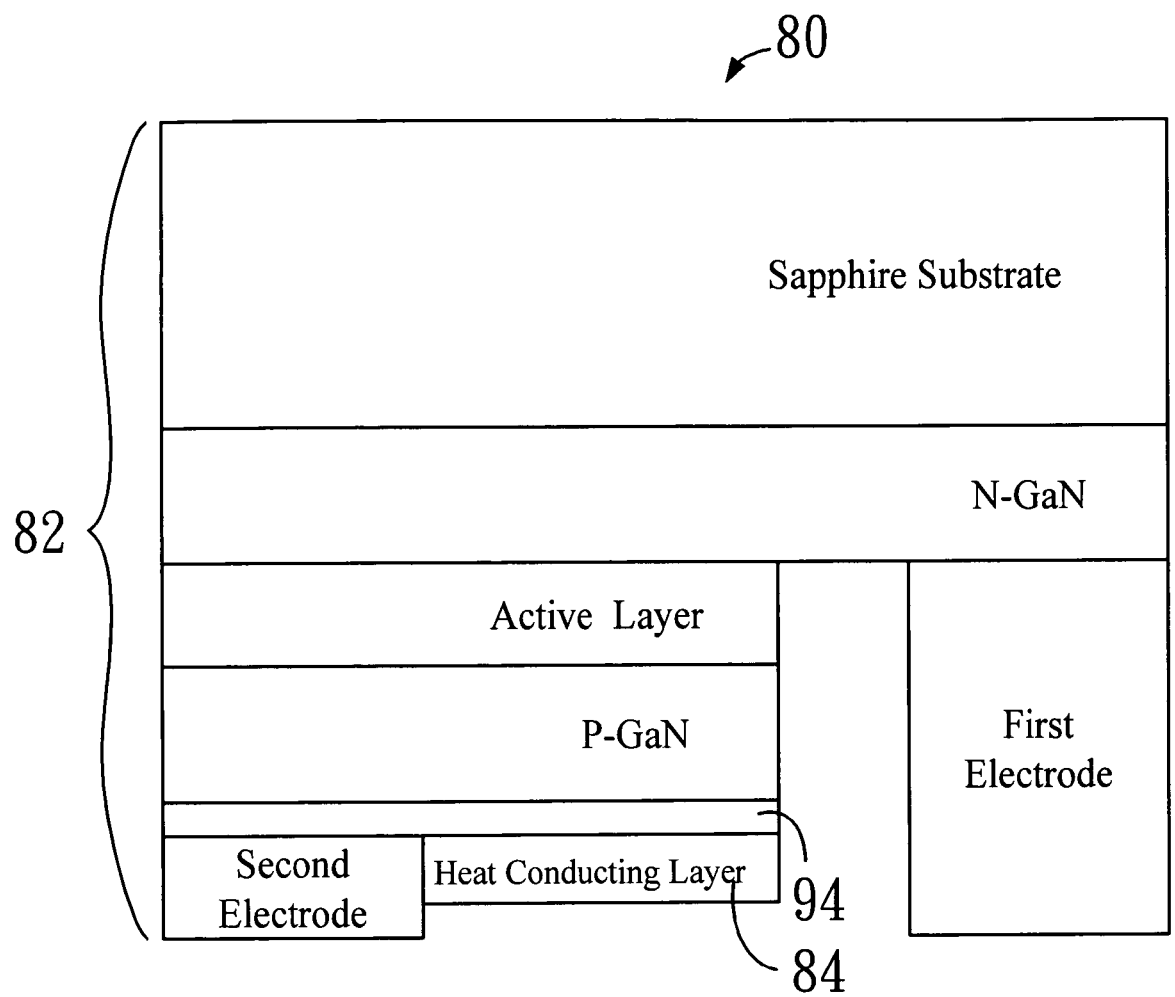
FIG. 3 is a schematic sectional view illustrating the third preferred embodiment of the semiconductor light emitting device according to the present invention.

Referring to FIG. 3, FIG. 3 is a schematic sectional view illustrating the third preferred embodiment of the semiconductor light emitting device 80 according to the present invention. Comparing with the second preferred embodiment in FIG. 2, the biggest difference between the semiconductor light emitting device 80 and the semiconductor light emitting device 50 is, by applying the technique of flip chip, the semiconductor light emitting device 80 inverses the semiconductor light emitting device 50 for 180 degrees to become the structure as shown in FIG. 3.

Therefore, when the semiconductor light emitting device 80 illuminates, the multi-layer light emitting structure 82 generates a great amount of thermal energy consequently. Since the material that formed the heat conducting layer 84 has higher thermal conductivity than that of the transparent conductive layer 94, the heat conducting layer 84 is able to transfer out the thermal energy of the multi-layer light emitting structure 82 rapidly, so as to lower the temperature of the multi-layer light emitting structure 82. Accordingly, the life time of the semiconductor light emitting device 80 can be prolonged, and the reliability of the semiconductor light emitting device 80 can be improved. In other words, the material that formed the heat conducting layer 84 has higher thermal conductivity than that of the transparent conductive layer 94, so the heat conducting layer 84 can also be indicated as a heatsink of the transparent conductive layer 94; therefore, the heat conducting layer 84 is able to transfer out the thermal energy of the multi-layer light emitting structure 82 rapidly, so as to lower the temperature of the multi-layer light emitting structure 82. Accordingly, the life time of the semiconductor light emitting device 80 can be prolonged, and the reliability of the semiconductor light emitting device 80 can be improved.

Figure 4:
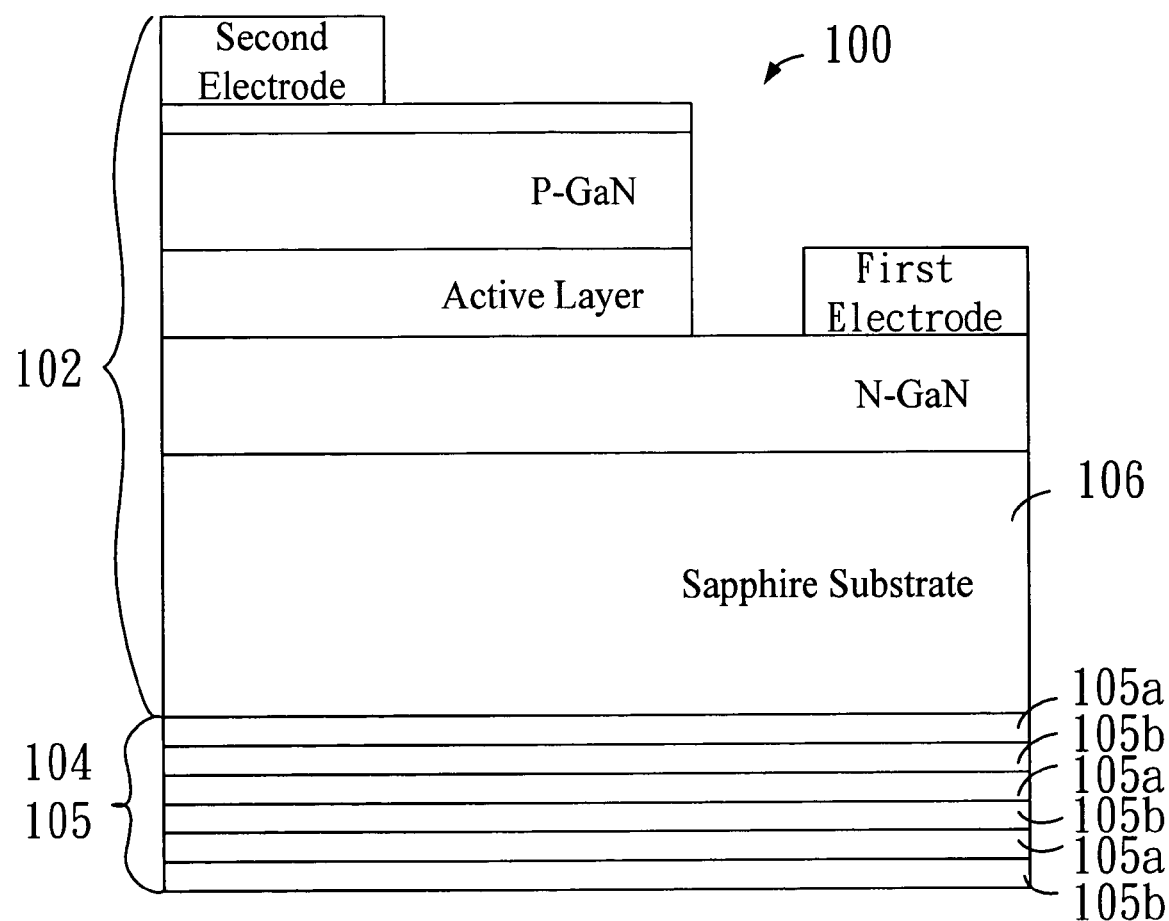
FIG. 4 is a schematic sectional view illustrating the fourth preferred embodiment of the semiconductor light emitting device according to the present invention.

Referring to FIG. 4, FIG. 4 is schematic sectional view illustrating the fourth preferred embodiment of the semiconductor light emitting device 100 according to the present invention. Comparing with the first preferred embodiment in FIG. 1, the biggest difference between the semiconductor light emitting device 100 and the semiconductor light emitting device 10 is in a distributed Bragg reflector 105 within the heat conducting layer 104 of the semiconductor light emitting device 100. The distributed Bragg reflector 105 comprises a fourth thermal conductivity which is higher than the first thermal conductivity of sapphire substrate 106. In this preferred embodiment, the distributed Bragg reflector 105 comprises a periodic structure stacked alternatively with a diamond layer 105a and an ITO layer 105b over the same area. The thickness of each layer of the distributed Bragg reflector 105 is $\lambda/(4n)$, wherein $\lambda$ represents the wavelength of the incident light of the distributed Bragg reflector 105, and n represents the reflection coefficient of the material that forms the distributed Bragg reflector 105. In the preferred embodiment, the reflection coefficient of the diamond layer 105a is 2.3, and the reflection coefficient of the ITO 105b is 1.7. The fourth thermal conductivity of the distributed Bragg reflector 105 is related to the thermal conductivity and thickness of the diamond layer 105a and to the thermal conductivity and thickness of the ITO layer 105b. The fourth thermal conductivity can be obtained by equation derivation or by experiment of the prior art. The equation derivation is as follows:

$$\overline{K} = \frac{\sum_{i=1}^{m} L_i}{\sum_{i=1}^{m} \frac{L_i}{K_i}}$$

Wherein, $\overline{K}$ is the effective thermal conductivity or the fourth thermal conductivity of the distributed Bragg reflector 105, m is the total layer number of the distributed Bragg reflector 105, $L_i$ is the thickness of the i-th layer, and $K_i$ is the thermal coefficient of the i-th layer.

Therefore, when the semiconductor light emitting device 100 illuminates, the multi-layer light emitting structure 102 generates a great amount of thermal energy consequently. Since the material that formed the heat conducting layer 104 has higher thermal conductivity than that of sapphire substrates 106, the heat conducting layer 104 is able to transfer out the thermal energy of the multi-layer light emitting structure 102 rapidly, so as to lower the temperature of the multi-layer light emitting structure 102. Accordingly, the life time of the semiconductor light emitting device 100 can be prolonged, and the reliability of the semiconductor light emitting device 100 can be improved. In other words, the material that formed the heat conducting layer 104 has higher thermal conductivity than that of sapphire substrates 106, so the heat conducting layer 104 can also be indicated as a heatsink of the sapphire substrate 106; therefore, the heat conducting layer 104 is able to transfer out the thermal energy of the multi-layer light emitting structure 102 rapidly, so as to lower the temperature of the multi-layer light emitting structure 102. Accordingly, the life time of the semiconductor light emitting device 100 can be prolonged, and the reliability of the semiconductor light emitting device 100 can be improved.

Figure 5:
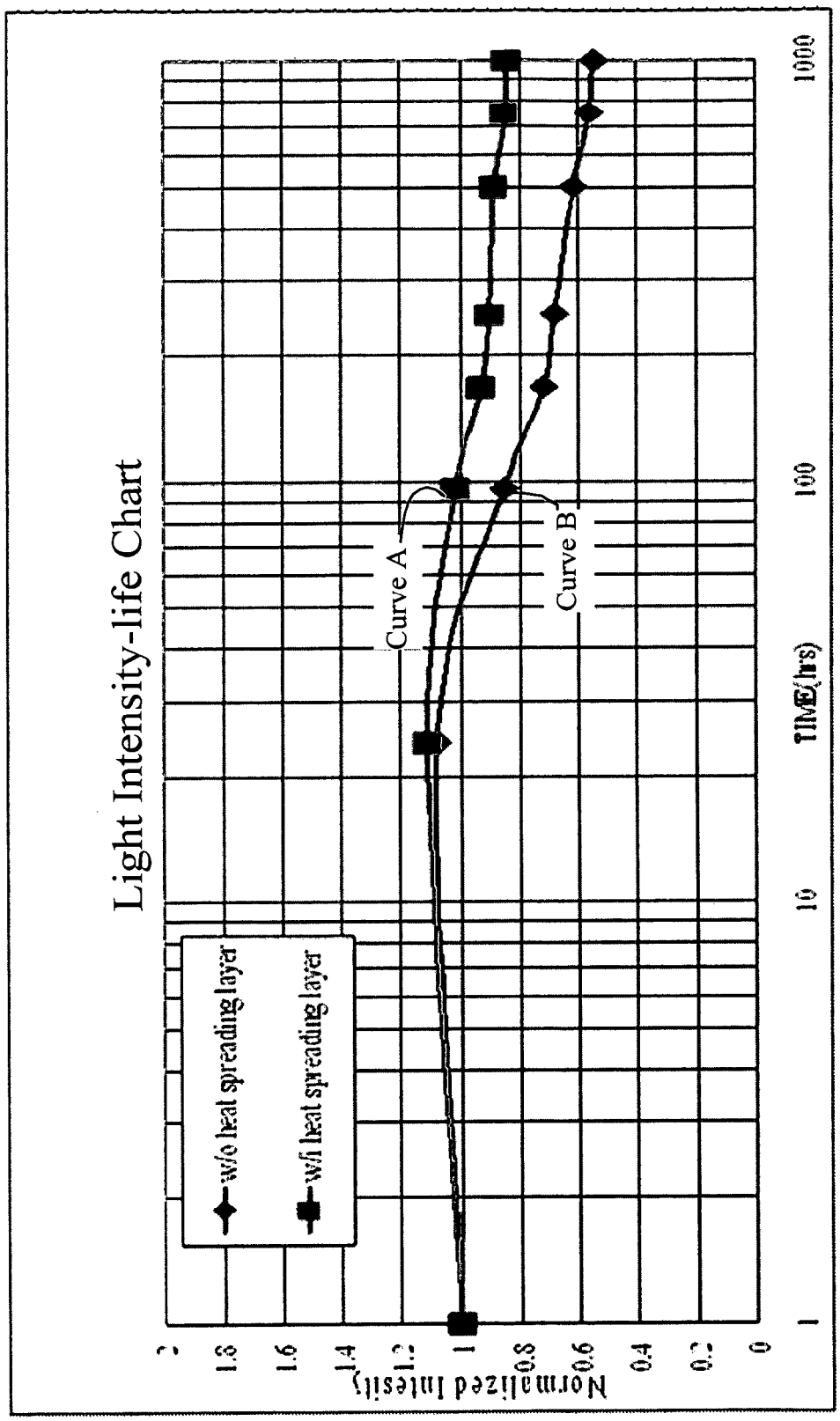
FIG. 5 is the light intensity-life chart of the semiconductor light emitting device in FIG. 1.
Figure 6:
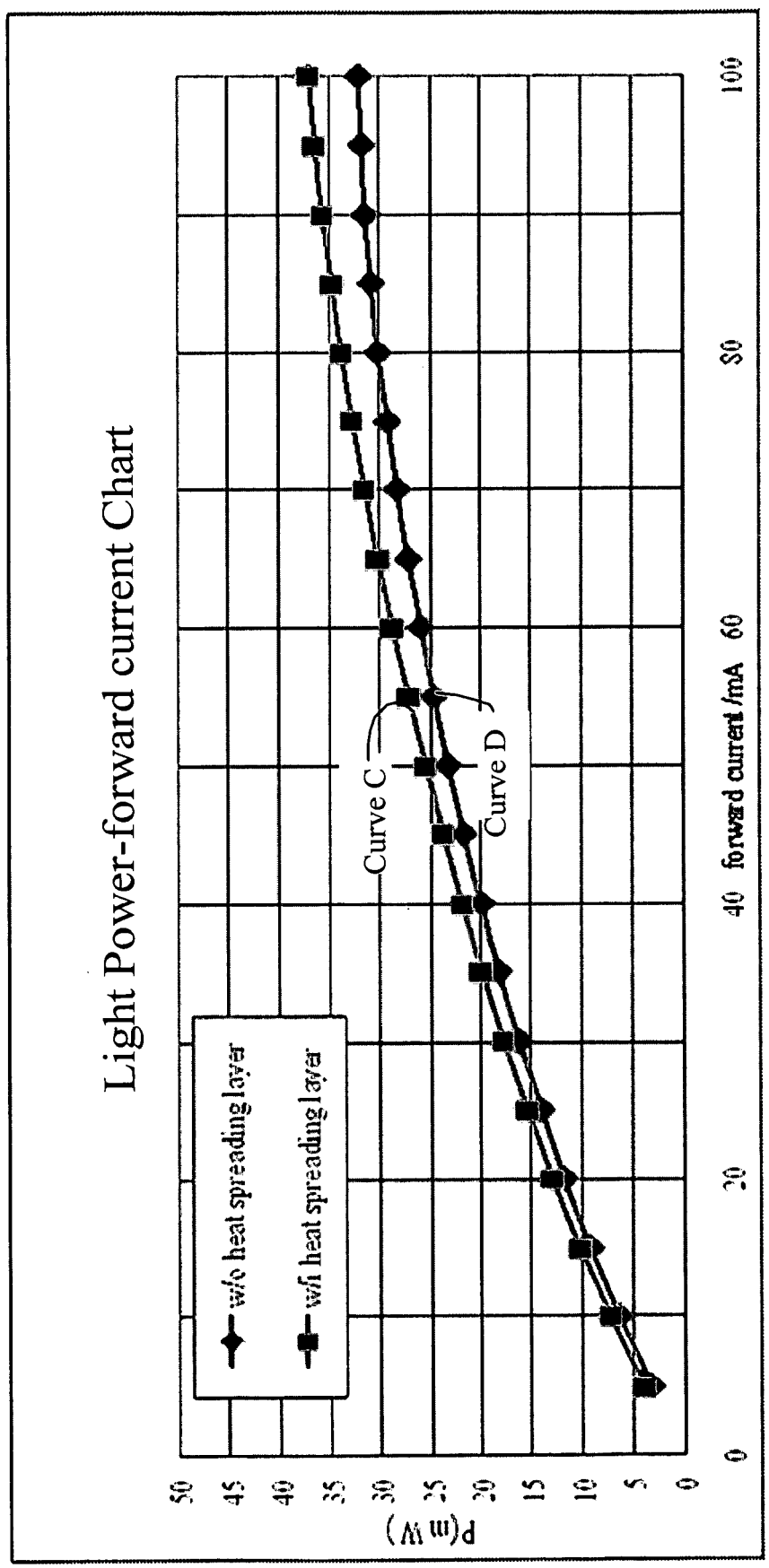
FIG. 6 is the light power-forward current chart of the semiconductor light emitting device in FIG. 1.

Referring to FIG. 5 and FIG. 6, FIG. 5 is the light intensity-life chart of the semiconductor light emitting device 10 in FIG. 1; and FIG. 6 is the light power-forward current chart of the semiconductor light emitting device 10 in FIG. 1.

FIG. 5 comprises curve A and curve B, and the y-axis of FIG. 5 represents normalized light intensity while x-axis represents time. The curve A represents the light intensity-life curve of the semiconductor light emitting device 10 with the heat conducting layer 14 shown in FIG. 1, and the curve B represents the light intensity-life curve of the semiconductor light emitting device of the prior art without the heat conducting layer. As shown in FIG. 5, when the semiconductor light emitting device has illuminated for about 25 hours, the light intensity of the semiconductor light emitting device 10 and the prior art without the structure of the heat conducting layer will attenuate gradually. However, curve A will take longer time than curve B to attenuate to the light intensity of the same level. In other words, by comparing the attenuation of the light intensity, the semiconductor light emitting device 10 with the heat conducting layer 14 will attenuate more slowly than the semiconductor light emitting device of the prior art without the structure of the heat conducting layer. Accordingly, the semiconductor light emitting device 10 with the heat conducting layer 14 will have longer life time and better reliability.

FIG. 6 comprises curve C and curve D, and y-axis of FIG. 6 represents the light power while x-axis represents the forward current of the semiconductor light emitting device. The curve C represents the light power-forward current curve of the semiconductor light emitting device 10 with the heat conducting layer 14 shown in FIG. 1, and the curve D represents the light power-forward current curve of the semiconductor light emitting device of the prior art without the heat conducting layer. As shown in FIG. 6, when the semiconductor light emitting device has a constant forward current, the semiconductor light emitting device 10 with the heat conducting layer 14 will have higher light power than the semiconductor light emitting device without the heat conducting layer. In other words, the semiconductor light emitting device 10 with the heat conducting layer 14 has better efficiency than the semiconductor light emitting device without the structure of the heat conducting layer. Accordingly, the semiconductor light emitting device 10 with the heat conducting layer 14 will have longer life time and better reliability.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light emitting device, comprising:
   a multi-layer light emitting structure, the multi-layer light emitting structure comprising a first conductivity type GaN layer with a first thermal conductivity; and
   a heat conducting layer with a second thermal conductivity, the heat conducting layer being formed on the first conductivity type GaN layer;
   wherein the second thermal conductivity is greater than the first thermal conductivity, and the material of the heat conducting layer comprises a periodic structure stacked alternatively with a diamond layer and an ITO layer.

2. The semiconductor light emitting device of claim 1, wherein the multi-layer light emitting structure further comprising:
   a substrate;
   a second conductivity type GaN layer, the second conductivity type GaN layer being formed on the substrate;
   an active layer, the active layer being formed on a first part of the surface of the second conductivity type GaN layer;
   a first electrode, the first electrode being formed on a second part of the surface of the second conductivity type GaN layer; and
   a second electrode, the second electrode being formed on a part of the surface of the first conductivity type GaN layer;
   wherein the first conductivity type GaN layer is formed on the active layer.

3. The semiconductor light emitting device of claim 2, wherein the multi-layer light emitting structure further comprises a transparent conductive layer being formed between the first conductivity type GaN layer and the second electrode.

4. The semiconductor light emitting device of claim 1, wherein the heat conducting layer is a distributed Bragg reflector.

5. A semiconductor light emitting device, comprising:
   a multi-layer light emitting structure, the multi-layer light emitting structure comprising a transparent conductive layer with a first thermal conductivity; and
   a heat conducting layer with a second thermal conductivity, the heat conducting layer being formed on the transparent conductive layer;
   wherein the second thermal conductivity is greater than the first thermal conductivity, and the material of the heat conducting layer comprises a periodic structure stacked alternatively with a diamond layer and an ITO layer.

6. The semiconductor light emitting device of the claim 5, wherein the multi-layer light emitting structure further comprising:
   a substrate;
   a second conductivity type GaN layer, the second conductivity type GaN layer being formed on the substrate;
   an active layer, the active layer being formed on a first part of the surface of the second conductivity type GaN layer;
   a first conductivity type GaN layer, the first conductivity type GaN layer being formed on the active layer;

a first electrode, the first electrode being formed on a second part of the surface of the second conductivity type GaN layer; and a second electrode, the second electrode being formed on a part of the surface of the first conductivity type GaN layer;

wherein the transparent conductive layer is formed between the first conductivity type GaN layer and the second electrode.

7. The semiconductor light emitting device of claim 5, wherein the heat conducting layer is a distributed Bragg reflector.

8. A semiconductor light emitting device, comprising:
a multi-layer light emitting structure, the multi-layer light emitting structure comprising a first layer with a first thermal conductivity; and
a heat conducting layer with a second thermal conductivity under the first layer;
wherein the second thermal conductivity is greater than the first thermal conductivity, and the material of the heat conducting layer comprises a periodic structure stacked alternatively with a diamond layer and an ITO layer.

9. The semiconductor light emitting device of claim 8, wherein the first layer is a substrate, the multi-layer light emitting structure further comprising:
a second conductivity type GaN layer, the second conductivity type GaN layer being formed on the substrate;
an active layer, the active layer being formed on a first part of the surface of the second conductivity type GaN layer;
a first conductivity type GaN, the first conductivity type GaN layer being formed on the active layer;
a first electrode, the first electrode being formed on a second part of the surface of the second conductivity type GaN layer; and
a second electrode, the second electrode being formed on a part of the surface of the first conductivity type GaN layer.

10. The semiconductor light emitting device of claim 9, wherein the multi-layer light emitting structure further comprises a transparent conductive layer formed between the first conductivity type GaN layer and the second electrode.

11. The semiconductor light emitting device of claim 8, wherein the first layer is a first conductivity type GaN layer, the multi-layer light emitting structure further comprising:
a substrate;
a second conductivity type GaN layer, the second conductivity type GaN layer being formed on the substrate;
an active layer, the active layer being formed on a first part of the surface of the second conductivity type GaN layer;
a first electrode, the first electrode being formed on a second part of the surface of the second conductivity type GaN layer; and
a second electrode, the second electrode being formed on a part of the surface of the first conductivity type GaN layer;
wherein the first conductivity type GaN layer is formed on the active layer.

12. The semiconductor light emitting device of the claim 8, wherein the first layer is a transparent conductive layer, the multi-layer light emitting structure further comprising:
a substrate;
a second conductivity type GaN layer, the second conductivity type GaN layer being formed on the substrate;
an active layer, the active layer being formed on a first part of the surface of the second conductivity type GaN layer;
a first conductivity type GaN, the first conductivity type GaN layer being formed on the active layer;
a first electrode, the first electrode being formed on a second part of the surface of the second conductivity type GaN layer; and
a second electrode, the second electrode being formed on a part of the surface of the first conductivity type GaN layer;
wherein the transparent conductive layer is formed between the first conductivity type GaN layer and the second electrode.

13. The semiconductor light emitting device of claim 8, wherein the heat conducting layer is a distributed Bragg reflector.

* * * * *